(12) United States Patent
Ito

(10) Patent No.: US 7,985,609 B2
(45) Date of Patent: Jul. 26, 2011

(54) LIGHT-EMITTING APPARATUS AND PRODUCTION METHOD THEREOF

(75) Inventor: Naoyuki Ito, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 97 days.

(21) Appl. No.: 11/939,733

(22) Filed: Nov. 14, 2007

(65) Prior Publication Data

US 2008/0116463 A1    May 22, 2008

(30) Foreign Application Priority Data

Nov. 17, 2006   (JP) .................................. 2006-311252
Oct. 29, 2007   (JP) .................................. 2007-280166

(51) Int. Cl.
*H01L 31/12* (2006.01)
*H01L 21/00* (2006.01)

(52) U.S. Cl. .................. 438/34; 257/83; 438/22

(58) Field of Classification Search ........... 257/79, 257/83, E33.064, 40, 59, 642, 643, 759, E21.16, 257/E21.478, E21.586; 438/24, 29, 69, 82, 438/99, 34, 944
See application file for complete search history.

(56) References Cited

U.S. PATENT DOCUMENTS

| | | | | |
|---|---|---|---|---|
| 6,900,470 B2 * | 5/2005 | Kobayashi et al. | ............ | 257/88 |
| 6,995,035 B2 * | 2/2006 | Cok et al. | ............ | 438/82 |
| 7,224,115 B2 * | 5/2007 | Sato et al. | ............ | 313/504 |
| 7,423,374 B2 * | 9/2008 | Okano | ............ | 313/509 |
| 7,427,783 B2 * | 9/2008 | Lee et al. | ............ | 257/88 |
| 2004/0160170 A1 * | 8/2004 | Sato et al. | ............ | 313/504 |
| 2006/0113900 A1 * | 6/2006 | Oh | ............ | 313/504 |
| 2006/0125390 A1 * | 6/2006 | Oh | ............ | 313/506 |
| 2006/0231830 A1 * | 10/2006 | Matsuda | ............ | 257/40 |
| 2007/0029929 A1 * | 2/2007 | Nakamura et al. | ............ | 313/506 |
| 2007/0077349 A1 * | 4/2007 | Newman et al. | ............ | 427/66 |
| 2007/0080356 A1 * | 4/2007 | Nakayama et al. | ............ | 257/88 |

FOREIGN PATENT DOCUMENTS

| | | |
|---|---|---|
| JP | 20032318556 | 10/2002 |
| JP | 2003316291 | 11/2003 |

* cited by examiner

*Primary Examiner* — Leonardo Andújar
*Assistant Examiner* — Jordan Klein
(74) *Attorney, Agent, or Firm* — Fitzpatrick, Cella, Harper & Scinto

(57) ABSTRACT

Provided is a light-emitting apparatus which can prevent a shadow mask from contacting a light-emitting medium to suppress damage of the medium, by using a conductive layer formed on a device isolation layer as a pressing member for the shadow mask, and can attain more secure conduction between a second electrode and an auxiliary electrode. A production method of the light-emitting apparatus includes forming first electrodes and auxiliary electrodes on a substrate; forming a device isolation layer between the first electrodes and forming an opening on each of the first electrodes and the auxiliary electrodes; forming a conductive layer on the device isolation layer so as to cover the openings above the auxiliary electrodes; bringing a shadow mask into contact with the conductive layer and forming a light-emitting medium in a thickness smaller than the thickness of the conductive layer; and forming a second electrode so as to cover the light-emitting medium, the device isolation layer, and the conductive layer.

7 Claims, 5 Drawing Sheets

LIGHT-EMITTING APPARATUS AND PRODUCTION METHOD THEREOF

BACKGROUND OF THE INVENTION

1. Field of the Invention

The present invention belongs to the field of technology of a light-emitting apparatus including a light-emitting device and a production method thereof.

2. Description of the Related Art

An organic electroluminescent device utilizing electroluminescence (hereinafter, simply referred to as EL) of an organic material has attracted attention as a light-emitting device which can emit light at a high luminance by low-voltage driving.

A display apparatus of an active matrix type using such an organic EL device (i.e., organic EL display) is provided with a thin film transistor (hereinafter, simply referred to as TFT) in each of pixels formed on a substrate. The organic EL device is formed on an interlayer insulating film formed so as to cover the TFTs.

The organic EL device has a first electrode patterned for each of the pixels in a state of being connected to the TFTs and an insulating device isolation layer which exposes the central portion of the first electrode as a pixel opening and cover the peripheral portion thereof. The device is configured to further include an organic layer provided on the first electrode in the pixel opening isolated by the device isolation layer, and a second electrode provided in a state of covering the organic layer. Of the electrodes, the second electrode is usually formed so as to cover a plurality of pixels, and is used commonly for the plurality of pixels.

In the organic EL device configured as described above, organic layers corresponding to each color are formed in the same stack structure within the pixel opening surrounded by the device isolation layer by use of several kinds of shadow masks, so that high mask alignment accuracy is required. In general, when an organic layer is formed by vapor deposition with a shadow mask, several kinds of shadow masks are pressed against to the device isolation layer, organic layers are formed into a stack film.

Further, in such an active matrix type display apparatus, in order to secure a pixel aperture ratio of the organic EL device, it is effective to adopt the so-called top emission structure in which light is extracted from the side opposite to the substrate. Hence, the second electrode is required to be small in thickness to secure light transmittance, whereby the resistance value increases to makes it easy to cause a voltage drop.

Hence, a configuration is proposed, in which an auxiliary electrode made of a metal material with good conductivity is formed, and the auxiliary electrode is connected to a second electrode, thereby preventing the voltage drop of the second electrode. In Japanese Patent Application Laid-Open No. 2002-318556, there is proposed a configuration in which an auxiliary electrode is formed in the same layer as a first electrode, an organic layer is then formed on the first electrode, after which a second electrode is formed, and the auxiliary electrode is then connected to the second electrode. Further, in Japanese Patent Application Laid-Open No. 2003-316291, a configuration is proposed in which an auxiliary electrode is formed on a bank, an organic light-emitting medium is then formed, and thereafter a second electrode is formed, and the auxiliary electrode is then connected to the second electrode.

As described above, when the organic layer is formed by vapor deposition using the shadow mask, organic layers are formed into a stack film with several kinds of the shadow masks being pressed against the device isolation layer. However, there has been a problem that at that time, the thus formed organic layers are damaged by the shadow masks to reduce the production yield.

However, although the display apparatus and the production method thereof as proposed in Japanese Patent Application Laid-Open No. 2002-318556 are configured to be capable of preventing the voltage drop of the second electrode, the above described problem is not yet solved.

Further, in the light-emitting apparatus and the production method as proposed in Japanese Patent Application Laid-Open No. 2003-316291, since the film deposition of the organic light-emitting medium is performed without bringing the mask into contact the substrate side, there are problems such that the film thickness of each pixel varies and a shift of the alignment is produced due to the bending of the mask. Further, there are also the problems that a film of the organic light-emitting medium is deposited on the auxiliary electrode to interrupt the electrical conduction between the auxiliary electrode and the second electrode, or the resistance value increases due to the organic light-emitting medium, so that the function as the auxiliary electrode cannot sufficiently be exhibited.

SUMMARY OF THE INVENTION

The present invention provides a light-emitting apparatus which can prevent a shadow mask from contacting a light-emitting medium to thereby suppress a damage of the light-emitting medium, by using a conductive layer formed on a device isolation layer as a pressing member for the shadow mask, and at the same time, can attain more secure conduction between a second electrode and an auxiliary electrode.

The present invention has been accomplished to solve the problems of the above described background art, and the production method of a light-emitting apparatus according to the present invention is a method of producing a light-emitting apparatus including a plurality of light-emitting devices each including a first electrode, a light-emitting medium, and a second electrode provided in the mentioned order on a substrate; a device isolation layer formed between the plurality of light-emitting devices and defining the respective light-emitting devices; and an auxiliary electrode formed between the substrate and the device isolation layer, which includes: forming a first electrode and an auxiliary electrode on a substrate, forming a device isolation layer between the plurality of first electrodes and forming an opening on each of the first electrode and the auxiliary electrode, forming a conductive layer on the device isolation layer so as to cover the opening above the auxiliary electrode; bringing a shadow mask into contact with the conductive layer and forming a light-emitting medium in a thickness smaller than the thickness of the conductive layer; and forming a second electrode so as to cover the light-emitting medium, the device isolation layer, and the conductive layer.

Further, the light-emitting apparatus according to the present invention includes: a substrate; a plurality of light-emitting devices formed on the substrate, each light-emitting device including a first electrode, a light-emitting medium patterned for each of the plurality of light-emitting devices, and a second electrode continuously formed so as to extend over the plurality of light-emitting devices, provided in the mentioned order on the substrate, a device isolation layer formed between the plurality of light-emitting devices and defining the respective light-emitting devices; an auxiliary electrode formed between the substrate and the device isolation layer; and a conductive layer formed on the device isolation layer, the conductive layer being in electrical conduction with the auxiliary electrode through an opening formed in the device isolation layer, and the second electrode and the auxiliary electrode being in electrically conduction with each other through the conductive layer, wherein the thickness of the conductive layer is larger than the thickness of the light-emitting medium.

According to the present invention, the conductive layer reaches an upper end planarizing portion of the device isolation layer, and the thickness of this upper end planarizing portion is formed thicker than the distance between the first electrode and the second electrode in a light-emitting region. The light-emitting medium is deposited by pressing the shadow mask on the conductive layer, so that no damage is given to the light-emitting medium and the production yield can be improved. Further, the light-emitting medium is deposited by pressing the shadow mask on the conductive layer, so that the second electrode and the auxiliary electrode can be more securely in electrical conduction.

Further features of the present invention will become apparent from the following description of exemplary embodiments with reference to the attached drawings.

DESCRIPTION OF THE EMBODIMENTS

The light-emitting apparatus according to the present invention includes a plurality of light-emitting devices each including a first electrode, a light-emitting medium, and a second electrode in the mentioned order on a substrate, a device isolation layer formed between the plurality of light-emitting devices and defining the respective light-emitting devices, and an auxiliary electrode formed between the substrate and the device isolation layer.

Hereinafter, an embodiment of a light-emitting apparatus and its production method according to the present invention will be described in detail with reference to the drawings. However, the present invention is not limited to the present embodiment.

First, a production method of the light-emitting apparatus will be described.

Figure 3:
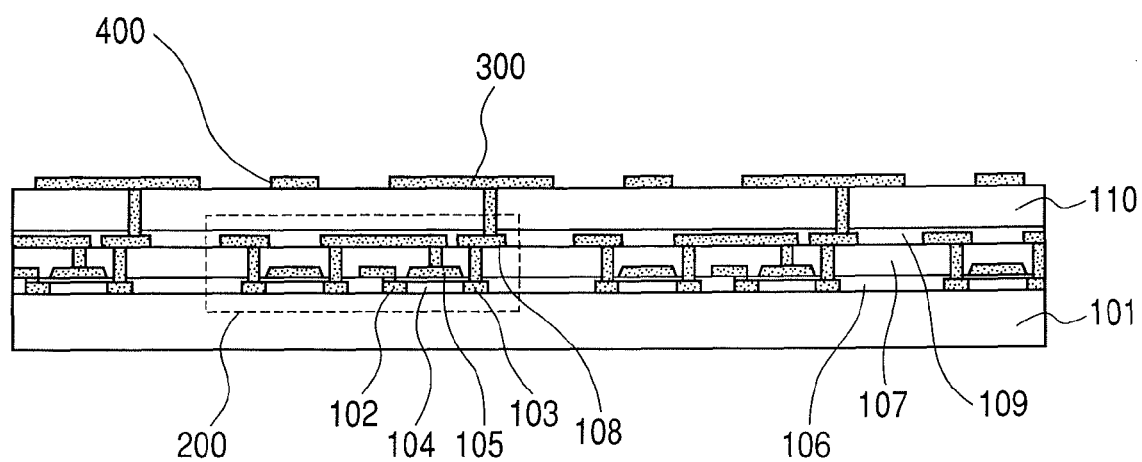
FIG. 3 is a schematic cross-sectional view illustrating an outline of a production step of a display apparatus of the present invention.

As shown in FIG. 3, on a substrate 101 such as a glass substrate, TFTs 200 are formed. In the figure, reference numeral 102 denotes a source region, reference numeral 103 a drain region, reference numeral 104 Poly-Si, reference numeral 105 a gate electrode, reference numeral 106 a gate insulating film, reference numeral 108 a drain electrode connected to the drain region, and reference numerals 107, 109 insulating films covering the drain electrode. Incidentally, the TFT 200 is not limited to an illustrated top gate type, and may be a bottom gate type.

To level unevenness generated on the substrate surface due to formation of the TFTs 200, a planarization layer 110 is formed on the substrate. In this case, for example, a positive photosensitive polyimide is coated on the substrate by a spin coating method, and pattern exposure is performed by an exposure device, and subsequently, image development is performed by a developing device, and after that, a post baking is performed.

First electrodes 300 and auxiliary electrode 400 are formed on the planarization layer 110. The auxiliary electrode 400 is formed so as to extend longitudinally or transversely in a light-emitting region formed by the plurality of light-emitting devices arranged. Hence, the auxiliary electrode is preferably configured to be formed in a stripe or lattice shape along the arrangement direction between the light-emitting devices arranged. Here, on the planarization layer 110, an Al film as a reflective layer is formed in a thickness of 100 nm, and a film of a conductive oxide material (for example, ITO) is formed in a thickness of approximately 20 nm by a sputtering method. Subsequently, by etching using a resist pattern formed by an ordinary lithographic technology as a mask, the metal material layer and conductive oxide material layer are patterned to thereby form the auxiliary electrode 400. Although in the present embodiment, the first electrode and the auxiliary electrode are formed on the same plane, the first electrode and the auxiliary electrode may be formed in different layers.

Figure 4:
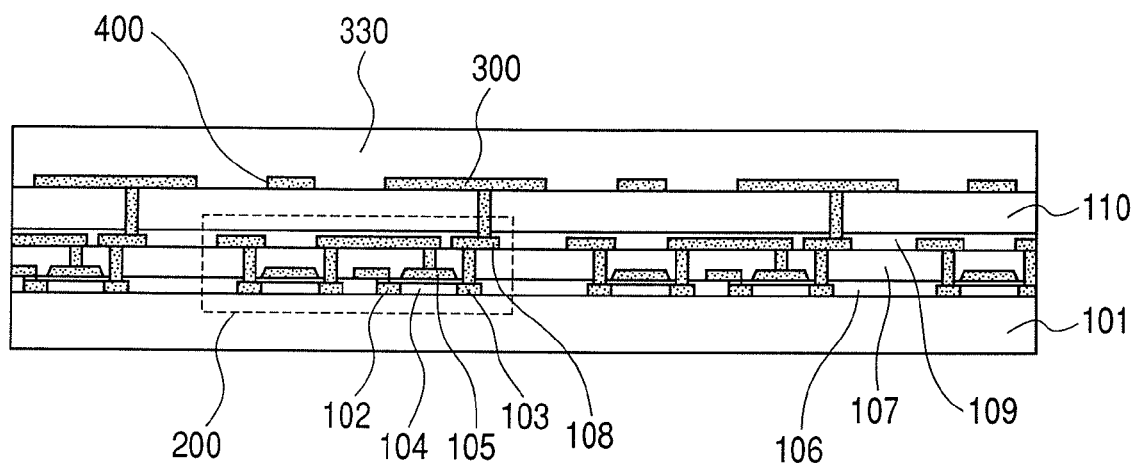
FIG. 4 is a schematic cross-sectional view illustrating an outline of a production step of the display apparatus of the present invention.
Figure 5:
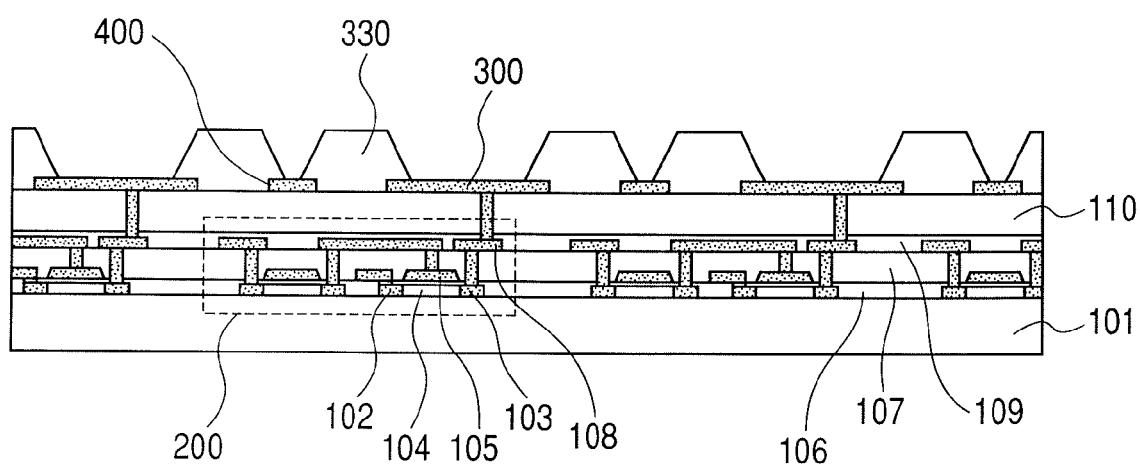
FIG. 5 is a schematic cross-sectional view illustrating an outline of a production step of the display apparatus of the present invention.

As shown in FIG. 4, as the device isolation layer 330, for example, a $SiO_2$ film is formed in a thickness of approximately 300 nm by using a CVD method. After that, as shown in FIG. 5, the $SiO_2$ film is patterned by etching using a resist pattern formed by using a lithographic technology as a mask. At this time, the etching is performed under such conditions that the etched side wall has a tapered shape. As a result, pixel opening portions where the center portion of the first electrode 300 is exposed and contact holes (openings) of the auxiliary electrode 400 are formed. In the region in which the pixel opening portion is formed, a light-emitting device is formed. That is, a plurality of light-emitting devices are defined by the device isolation layer.

Figure 6:
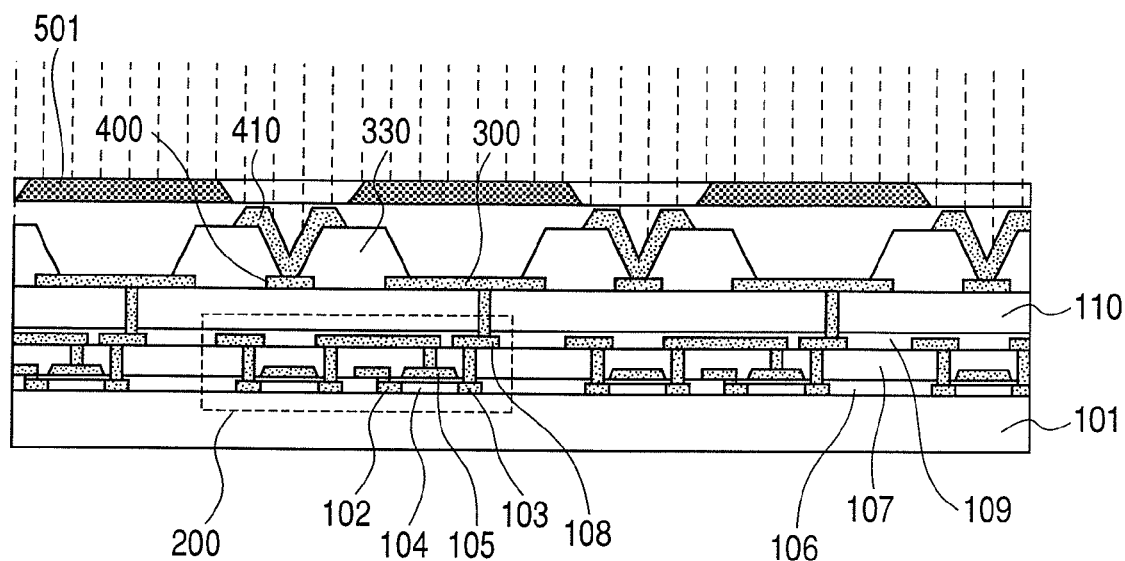
FIG. 6 is a schematic cross-sectional view illustrating an outline of a production step of the display apparatus of the present invention.
Figure 7:
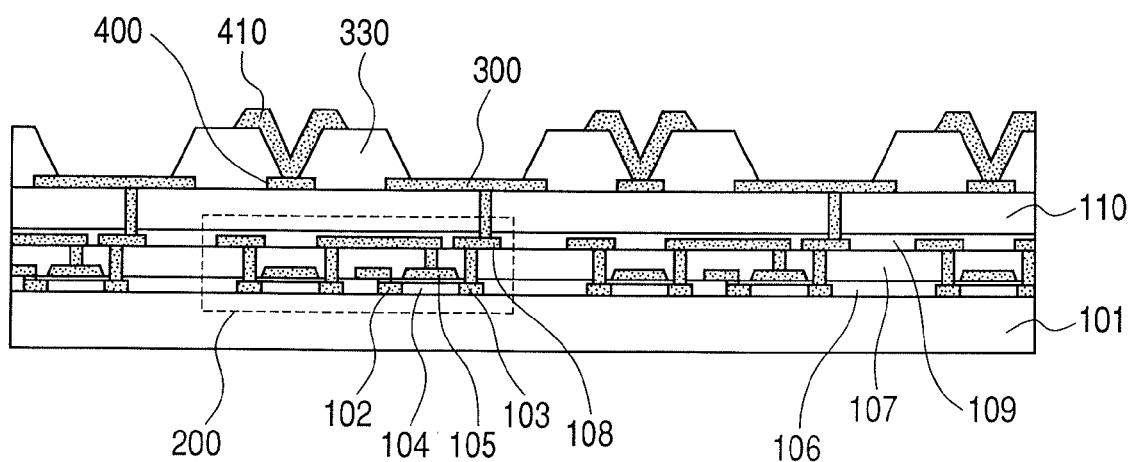
FIG. 7 is a schematic cross-sectional view illustrating an outline of a production step of the display apparatus of the present invention.

Subsequently, as shown in FIGS. 6 and 7, conductive layers 410 are each formed so as to reach up to the upper flat surface portions of adjacent parts of the device isolation layer 330 from the contact hole and have a thickness on the upper flat surface portion which is larger than the distance between the first electrode 300 and the second electrode 320. In the present embodiment, by using a shadow mask 501, an Al film is formed in a thickness of 400 nm by use of a vapor deposition method. At this time, the plurality of conductive layers 410 are formed distant from one another each in a dot shape. This is because the formation of the conductive layers 410 on the device isolation layer 330 in a stripe or lattice shape is difficult. When the conductive layers are to be formed in a stripe or lattice shape, patterning using a mask is ordinarily adopted. However, because it is extremely difficult to form a mask opening in a stripe or lattice shape, sufficient alignment accuracy cannot be obtained. Hence, by depositing a patterned film by using a mask with a dot-shaped opening, the electrical conduction between the auxiliary electrode and the second electrode is secured while maintaining sufficient alignment accuracy.

Incidentally, although the conductive layers 410 are formed by the Al vapor deposition using the shadow mask, the conductive layers may be formed by a sputtering method or etching using a photoresist process.

Figure 8:
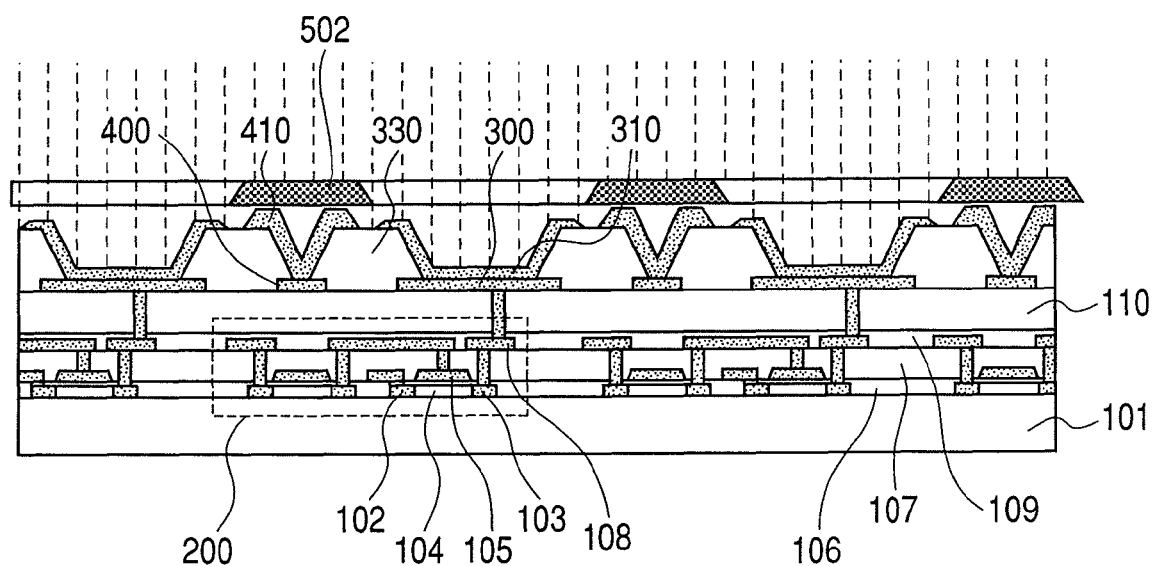
FIG. 8 is a schematic cross-sectional view illustrating an outline of a production step of the display apparatus of the present invention.

Then, as shown in FIG. 8, a light-emitting medium 310 is pattern-formed so as to cover the first electrode 300 exposed in the pixel opening portion. At this time, in a state in which a shadow mask 502 abuts on the conductive layer 410, the light-emitting medium 310 is deposited. Therefore, the light-emitting medium 310 is not damaged, so that the production yield can be improved. Further, there is caused no interruption of the electrical conduction between the conductive layer 410 and the second electrode 320 due to adhesion of the light-emitting medium 310 to the conductive layer 410, so that better electrical connection can be achieved. Further, because the conductive layer 410 is formed in a recessed manner by following the shape of the contact hole (opening) formed in the device isolation layer 330, the electrical connection between the conductive layer 410 and the second electrode 320 is achieved at the recessed portion and not hindered by the film deposition of the light-emitting medium 310.

Figure 9:
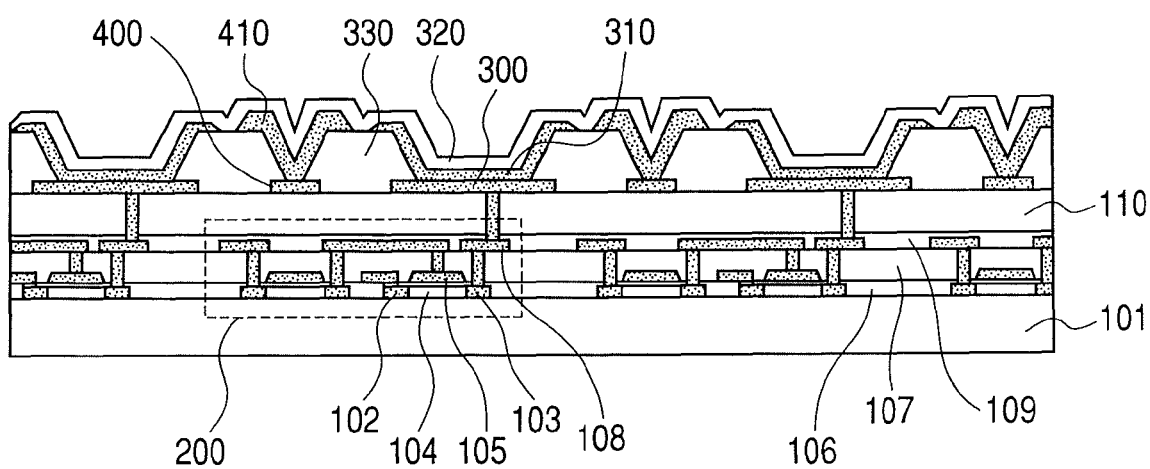
FIG. 9 is a schematic cross-sectional view illustrating an outline of a production step of the display apparatus of the present invention.

Next, as shown in FIG. 9, a second electrode 320 is formed so as to cover the light-emitting medium 310, the device isolation layer 330, and the conductive layer 410. As a result, the second electrode 320 is connected to the auxiliary electrode 400 through the conductive layer 410. Here, as the second electrode 320, for example, an In-Zn-O based transparent conductive film (IZO) which is a transparent conductive film is formed in a thickness of approximately 200 nm.

Next, the configuration of the light-emitting apparatus obtained by the above described production method will be described.

The light-emitting apparatus of the present embodiment is a display apparatus of an active matrix type in which organic EL devices are arranged as the light-emitting devices.

Figure 1:
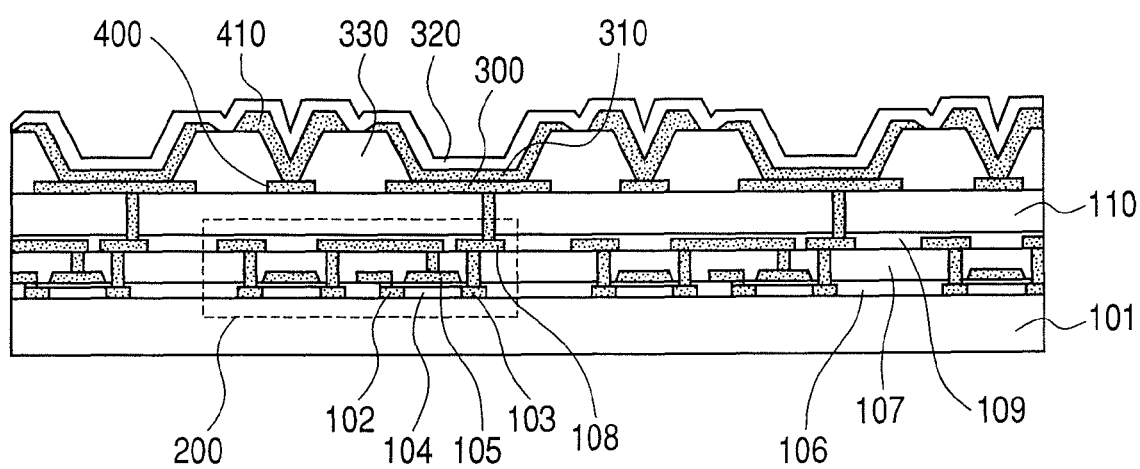
FIG. 1 is a schematic cross-sectional view illustrating a schematic configuration of a display region in a display apparatus of the present invention.

As shown in FIG. 1, the light-emitting apparatus is formed such that the TFTs 200 are formed at positions corresponding to the respective pixels on the substrate 101, and the planarization layer 110 is formed so as to cover the TFTs 200. At the pixel opening portions surrounded by the device isolation layer 330 on the planarization layer 110, there are formed organic EL devices having the first electrode 300, the light-emitting medium 310, and the second electrode 320 stacked in the mentioned order.

In the present display apparatus, the auxiliary electrode 400 is formed on the same layer as the first electrode 300, between adjacent pixels, that is, between the device isolation layers 330, 330, and the auxiliary electrode 400 is electrically connected to the second electrode 320 through the conductive layer 410. Therefore, the transparent conductive film constituting the second electrode 320 can be made thin, and yet even when the area of the image display portion is enlarged to attain a large area screen, lowering of the response speed and increase of the power consumption of the organic EL device due to increase of the resistance value can be prevented. Further, the in-plane potential distribution can be suppressed to eliminate variation of luminance.

Particularly, the conductive layer 410 reaches the upper flat surface portion of the device isolation layer 330 from the contact hole of the auxiliary electrode 400, and the thickness of the part thereof on the upper flat surface portion is made larger than the distance between the first electrode 300 and the second electrode 320. Hence, as described above, when the shadow mask is pressed against the conductive layer 410 and the light-emitting medium 310 is deposited in a film, the production yield can be improved without damaging the light-emitting medium layer 310.

Moreover, when the area of the display portion of the display apparatus is enlarged to attain a large area screen, because the contact of a color filter or a sealing substrate with the pixel can be prevented, the production yield can also be improved without damaging the pixel.

The auxiliary electrode 400, as described above, is formed on the same layer as the planarization layer 110, that is, the first electrode 300, and for example, is continuously arranged in a mesh shape between the pixel opening portions which are arranged in a matrix pattern on the substrate 101, while being insulated from the first electrode 300. Further, the auxiliary electrode 400 is connected to the conductive layer 410 through the contact hole formed between adjacent device isolation layers 330, 330.

The auxiliary electrode 400 is preferably formed of, for example, aluminum or an alloy of aluminum with titanium, scandium, niobium, copper or silicon. Alternatively, the auxiliary electrode 400 may be formed of a single substance of titanium, titanium nitride, tantalum, tungsten, or molybdenum, or an alloy or a stack film of the substances, and may be constituted of the same material as the first electrode 300.

The conductive layer 410 reaches the upper flat surface portion of the device isolation layer 330 from the contact hole of the auxiliary electrode 400, and the thickness of the part thereof on the upper flat surface portion is made larger than the distance between the first electrode 300 and the second electrode 320 in the light-emitting region. At this time, the material, contact area, thickness or the like of the conductive layer 410 is set so as to give a resistance value enough to attain electrical conduction between the auxiliary electrode 400 and the second electrode 320.

The conductive layer 410 is preferably formed of a conductive material which has a good contact property with a conductive material constituting the second electrode 320 and also has a small resistivity. Specifically, the conductive layer 410 may preferably be formed of aluminum; an alloy of aluminum with titanium, scandium, niobium, copper or silicon; a single substance of titanium, titanium nitride, tantalum, tungsten, or molybdenum; or an alloy or a stack film of those substances.

Incidentally, in order to improve the coverage of the conductive layer 410 and not to generate a crack in a step portion, it is desirable to work end portions thereof in a tapered shape.

Further, the thickness of the conductive layer 410 is preferably larger than the distance between the first electrode 300 and the second electrode 320 not only at the upper flat surface portion of the device isolation layer 330 but also at the upper inclined surface portion.

The other constituent members are configured to be the same as the ordinary light-emitting apparatuses.

When the first electrode 300 is used as a cathode and the second electrode 320 is used as an anode, the first electrode 300 is formed of an alloy or a compound of a Group 1 or 2 element of the periodic table, and is formed of aluminum or silver, or an alloy of aluminum or neodymium. Alternatively, there may be used a composite layer obtained by stacking, on the above-mentioned reflective electrode, a layer of indium tin oxide, zinc oxide, zinc oxide added with gallium, or a compound thereof.

The second electrode 320 is formed of indium tin oxide, zinc oxide, zinc oxide added with gallium, or a compound thereof. In order to bring the second electrode 320 and the light-emitting medium 310 into good contact with each other, a thin metal layer (not shown) may be provided at a boundary thereof.

When the first electrode 300 is used as an anode and the second electrode 320 is used as a cathode, the first electrode 300 is formed of indium tin oxide, zinc oxide, zinc oxide added with gallium, or a compound thereof, or a conductive material having a work function equivalent to those of the above-motioned substances. Alternatively, the first electrode 300 is formed of an alloy or a compound of a Group 1 or 2 element of the periodic table. For example, there may be used a composite layer obtained by stacking, on a reflective electrode formed of aluminum or silver, or an alloy of aluminum or neodymium, a layer of indium tin oxide, zinc oxide, zinc oxide added with gallium, or a compound thereof.

The second electrode 320 is formed of an alloy or a compound of a Group 1 or 2 element of the periodic table, and is preferably formed of an alloy of aluminum or silver. However, to allow the second electrode 320 to have light transmittance, it may be made extremely thin, and stacked with a transparent conductive film such as indium tin oxide.

Further, there may be provided, under the metal material layer, a conductive oxide material layer serving as an adhesive layer with the underlying planarization layer 110, thereby realizing a three layer structure in which the metal material layer is interposed between the conductive oxide material layers.

The light-emitting medium 310 has a configuration obtained by suitably combining a hole injecting/transporting layer on an anode side, an electron injecting/transporting layer on a cathode side, a light-emitting layer, and the like. The hole injecting/transporting layer or the electron injecting/transporting layer may be a combination of a material excellent in efficiency of injection of holes/electrons from an electrode and a material excellent in transportability (mobility).

Figure 2:
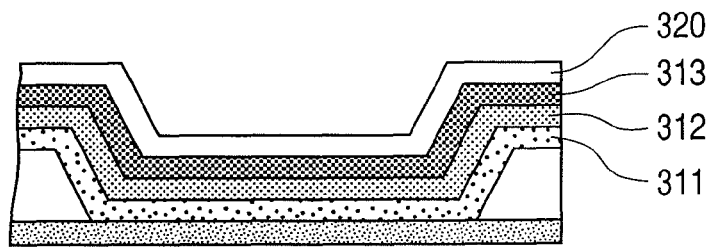
FIG. 2 is a schematic cross-sectional view illustrating a schematic configuration of an organic EL device in a display apparatus of the present invention.

As shown in FIG. 2, the light-emitting medium 310 is constituted of, for example, three layers of a hole transporting layer 311, a light-emitting layer 312, and an electron-transporting layer 313, but may be constituted of the light-emitting layer 312 only, or may be constituted of a plurality of layers such as two or four layers. The thickness of the light-emitting medium is made smaller than the thickness of the conductive layer. Thereby, the light-emitting medium can be deposited in film without contacting the mask. Particularly, in a case of a light-emitting apparatus having a plurality of light-emitting devices of different emission colors, and when a plurality of layers are formed by using a plurality of shadow masks with different mask opening patterns, the effect of avoiding contact of the light-emitting medium with the mask is very advantageous.

For the hole transporting layer 311, for example, NPD is used, but other materials may be used.

The light-emitting layer 312 is provided for each emission color, and is separately deposited by use of a shadow mask. When a display apparatus which emit the colors of RGB is configured, as a red-light-emitting layer, for example, CBP doped with Ir(piq)3 is used. As a green-light-emitting layer, for example, Alq3 doped with coumarin is used, and as a blue-light-emitting layer, B-Alq3 doped with Perylene is used. However, other materials may also be used.

For the electron-transporting layer 313, for example, Bathophenantroline having electron acceptability is used, but other materials may also be used.

The device isolation layer 330 is an insulating film provided between adjacent pixels and is formed so as to cover the peripheral edge portion of the first electrode 300, and between adjacent device isolation layers 330 is formed a contact hole of the auxiliary electrode 400. The device isolation layer 330 is formed of an inorganic insulating film such as silicon nitride, silicon oxide, silicon oxynitride, and the like, an organic insulating film such as acrylic resin, polyimide resin, novolac resin, and the like.

In order to prevent deterioration by moisture from the outside, a glass substrate (not shown) is bonded to the substrate 101 by using a UV curable epoxy resin in a nitrogen atmosphere at a temperature below a dew point of −60° C. On the organic EL device side of the glass substrate, a moisture absorbing film such as strontium oxide or calcium oxide is preferably formed. Further, although in the present configuration, sealing is performed by using a glass substrate, the sealing may be performed by using an inorganic insulating film such as silicon nitride, silicon oxide, silicon oxynitride, and the like.

Further, in place of the glass substrate, a color filter may be provided, and a coloring layer corresponding to each device and a protective film may be formed. At that time, the device is preferably protected from the glass substrate and the color filter by means of the conductive layer 410.

The light-emitting apparatus according to the present invention can be applied to the display apparatus as a whole which is required to be electrically connected such as the organic EL display apparatus, the inorganic EL display apparatus, and the like. Further, as a display apparatus, the present light-emitting apparatus can be preferably used for a television receiver, a monitor of a computer, a display of a mobile phone, a display of a personal digital assistant (PDA), a display of a portable audio player, a rear surface display of an imaging apparatus, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-311252, filed Nov. 17, 2006, No. 2007-280166 filed Oct. 29, 2007 which are hereby incorporated by reference herein in their entirety.

What is claimed is:

1. A method of producing a light-emitting apparatus having a plurality of light-emitting devices each having a first electrode, a second electrode, and a light-emitting medium between the first electrode and the second electrode on a substrate; a device isolation layer formed between the plurality of light-emitting devices;

and an auxiliary electrode electrically connected to the second electrode, the method comprising:

forming the first electrode and the auxiliary electrode on the substrate;

forming the device isolation layer by forming a layer over the first electrode and the auxiliary electrode and, thereafter, forming an opening in the layer on each of the first electrode and the auxiliary electrode;

forming a conductive layer on the device isolation layer so as to cover the opening above the auxiliary electrode;

bringing a shadow mask into contact with the conductive layer and forming the light-emitting medium in a thickness smaller than the thickness of the conductive layer so as to cover the opening above the first electrode; and forming the second electrode so as to cover the light-emitting medium, the device isolation layer, and the conductive layer.

2. The production method according to claim 1, wherein the formation of the light-emitting medium comprises forming a plurality of layers using a plurality of shadow masks with different mask opening patterns.

3. The production method according to claim 1, wherein the formation of the conductive layer is performed by a vapor deposition method using a mask.

4. The production method according to claim 1, wherein the formation of the light-emitting medium comprises forming the light-emitting medium which covers a part of an upper portion of the device isolation layer.

5. A method of producing a light-emitting apparatus having a plurality of light-emitting devices each having a first electrode, a second electrode, and a light-emitting medium between the first electrode and the second electrode on a substrate; a device isolation layer formed between the plurality of light-emitting devices; and an auxiliary electrode electrically connected to the second electrode, the method comprising:

forming the first electrode and the auxiliary electrode on the substrate;

forming the device isolation layer by forming a layer over the first electrode and the auxiliary electrode and, thereafter, forming an opening in the layer on each of the first electrodes and the auxiliary electrode;

forming a conductive layer on the device isolation layer so as to cover the openings above the auxiliary electrode;

forming the light-emitting medium in which a shadow mask abuts the conductive layer so as to cover the opening above the first electrode, and the thickness of the conductive layer is larger than the light-emitting medium; and forming the second electrode so as to cover the light-emitting medium, the device isolation layer, and the conductive layer.

6. A method of producing a light-emitting apparatus having a plurality of light-emitting devices each having a first electrode, a second electrode, and a light-emitting medium between the first electrode and the second electrode on a substrate; a device isolation layer formed between the plurality of light-emitting devices;

and an auxiliary electrode electrically connected to the second electrode, the method comprising:

forming the first electrode and the auxiliary electrode on the substrate;

forming the device isolation layer by forming a layer over the first electrode and the auxiliary electrode and, thereafter, forming an opening in the layer on each of the first electrodes and the auxiliary electrodes;

forming a conductive layer on the device isolation layer so as to cover the openings above the auxiliary electrodes;

bringing a shadow mask into contact with the conductive layer and forming a light-emitting medium so as to cover the opening above the first electrode; and forming the second electrode so as to cover the light-emitting medium, the device isolation layer, and the conductive layer.

7. The production method according to any one of claims 1, 5, and 6, wherein the forming the first electrode and the auxiliary electrode on the substrate step comprises:

forming a transistor on the substrate;

forming a planarization layer on the transistor; and forming the first electrode and the auxiliary electrode on the planarization layer.

\* \* \* \* \*